United States Patent
Komiya

(10) Patent No.: US 7,570,084 B2
(45) Date of Patent: Aug. 4, 2009

(54) SEMICONDUCTOR INTEGRATED CIRCUIT OUTPUTTING DETECTION SIGNAL BASED ON DETECTION RESULT OF A DETECTING DEVICE AND ELECTRONIC DEVICE INCLUDING THE SAME

(75) Inventor: Kunihiro Komiya, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 14 days.

(21) Appl. No.: 11/832,316

(22) Filed: Aug. 1, 2007

(65) Prior Publication Data

US 2008/0030258 A1 Feb. 7, 2008

(30) Foreign Application Priority Data

Aug. 4, 2006 (JP) ............... 2006-213280

(51) Int. Cl.
*H03K 5/153* (2006.01)
(52) U.S. Cl. ............... 327/77; 327/205; 327/206
(58) Field of Classification Search ............ 327/77, 327/205, 206
See application file for complete search history.

(56) References Cited

U.S. PATENT DOCUMENTS

| | | | | |
|---|---|---|---|---|
| 4,584,492 A | * | 4/1986 | Sharp | 326/70 |
| 4,602,169 A | * | 7/1986 | Shimizu | 327/73 |
| 5,455,522 A | * | 10/1995 | Jones | 326/27 |
| 5,541,799 A | * | 7/1996 | Schmidt et al. | 361/18 |
| 5,892,389 A | * | 4/1999 | Lai | 327/543 |
| 5,973,551 A | * | 10/1999 | Mitsuda | 327/543 |
| 6,046,615 A | * | 4/2000 | Chevallier et al. | 327/143 |
| 6,140,868 A | * | 10/2000 | Shoaei et al. | 327/561 |
| 6,163,190 A | * | 12/2000 | Takai et al. | 327/205 |
| 6,229,352 B1 | * | 5/2001 | Chevallier et al. | 327/77 |
| 6,313,684 B1 | * | 11/2001 | Bontempo | 327/295 |
| 6,693,466 B2 | * | 2/2004 | Inoue et al. | 327/72 |
| 6,737,909 B2 | * | 5/2004 | Jaussi et al. | 327/541 |
| 6,897,713 B1 | * | 5/2005 | Nguyen et al. | 327/541 |
| 6,906,658 B2 | * | 6/2005 | Pentakota et al. | 341/172 |
| 6,956,413 B2 | * | 10/2005 | Bailey | 327/131 |
| 7,042,373 B2 | * | 5/2006 | Tsai et al. | 341/120 |
| 7,046,078 B2 | * | 5/2006 | Nguyen et al. | 327/541 |
| 7,064,602 B2 | * | 6/2006 | Nguyen | 327/541 |
| 7,081,776 B2 | * | 7/2006 | Kato et al. | 327/77 |
| 7,099,786 B2 | * | 8/2006 | Nguyen et al. | 702/62 |
| 7,142,044 B2 | * | 11/2006 | Sano | 327/540 |
| 7,170,330 B2 | * | 1/2007 | Kamei | 327/205 |
| 7,199,645 B2 | * | 4/2007 | Chang et al. | 327/538 |
| 7,221,808 B2 | * | 5/2007 | Shinotsuka et al. | 382/274 |

(Continued)

FOREIGN PATENT DOCUMENTS

JP 61-163738 7/1986

(Continued)

*Primary Examiner*—Lincoln Donovan
*Assistant Examiner*—Adam D Houston
(74) *Attorney, Agent, or Firm*—Fish & Richardson P.C.

(57) ABSTRACT

A semiconductor integrated circuit includes a first external terminal for receiving a voltage converted by a resistance portion from a current varying in response to an extrinsic factor, a second external terminal for externally outputting the voltage received at the first external terminal as a detection signal, a control circuit outputting a control signal for changing a resistance value of the resistance portion based on the voltage received at the first external terminal, and a third external terminal for outputting the control signal to the resistance portion.

8 Claims, 3 Drawing Sheets

U.S. PATENT DOCUMENTS

| | | | |
|---|---|---|---|
| 7,265,607 B1 * | 9/2007 | Rajapandian et al. | 327/541 |
| 7,282,989 B2 * | 10/2007 | Byeon | 327/541 |
| 7,417,494 B2 * | 8/2008 | Choi et al. | 327/541 |
| 2005/0162207 A1 * | 7/2005 | Kamei | 327/205 |
| 2005/0184895 A1 * | 8/2005 | Petersen et al. | 341/143 |
| 2006/0170462 A1 * | 8/2006 | Bhattacharya et al. | 327/77 |
| 2006/0181314 A1 * | 8/2006 | Yeo et al. | 327/77 |
| 2006/0192597 A1 * | 8/2006 | Johns et al. | 327/77 |
| 2007/0285152 A1 * | 12/2007 | Fujita et al. | 327/541 |
| 2008/0030258 A1 * | 2/2008 | Komiya | 327/509 |
| 2008/0048746 A1 * | 2/2008 | Raman | 327/205 |
| 2008/0088358 A1 * | 4/2008 | Caplan et al. | 327/534 |
| 2008/0237669 A1 * | 10/2008 | Yanagisawa et al. | 257/292 |
| 2009/0027314 A1 * | 1/2009 | Kohno et al. | 345/76 |
| 2009/0027374 A1 * | 1/2009 | Kohno et al. | 345/212 |
| 2009/0040172 A1 * | 2/2009 | Lien et al. | 345/102 |

FOREIGN PATENT DOCUMENTS

| | | | |
|---|---|---|---|
| JP | 2008041884 A | * | 2/2008 |

* cited by examiner

SEMICONDUCTOR INTEGRATED CIRCUIT OUTPUTTING DETECTION SIGNAL BASED ON DETECTION RESULT OF A DETECTING DEVICE AND ELECTRONIC DEVICE INCLUDING THE SAME

BACKGROUND OF THE INVENTION

1. Field of the Invention

The present invention relates to a semiconductor integrated circuit and an electronic device including the same. Specifically, the present invention relates to a semiconductor integrated circuit outputting a detection signal based on a result of detection by a detecting device and to an electronic device including such a circuit.

2. Description of the Background Art

In an electronic device such as a liquid crystal television or a portable telephone including a detecting device represented by an illuminance sensor, a semiconductor integrated circuit outputting a detection signal based on the result of detection by the detecting device is used. By way of example, Japanese Patent Laying-Open No. 61-163738 (Patent Document 1) discloses a circuit that obtains a photoelectric conversion signal from a photoelectric conversion module.

In the semiconductor integrated circuit outputting a detection signal based on the result of detection by the detecting device, conventionally, a structure in which, for example, a current flowing through the detecting device is converted to a voltage by means of a resistor, and the converted voltage is converted to a digital signal by an AD (Analog to Digital) converter, has been used.

In the conventional semiconductor integrated circuit as such, however, the range of detection is limited by the dynamic range of the AD converter.

SUMMARY OF THE INVENTION

An object of the present invention is to provide a semiconductor integrated circuit capable of obtaining result of detection over a wide range and an electronic device including such a circuit.

According to an aspect, the present invention provides a semiconductor integrated circuit including: a first external terminal for receiving a voltage converted by a resistance portion from a current varying in response to an extrinsic factor; a second external terminal for externally outputting the voltage received at the first external terminal as a detection signal; a control circuit outputting a control signal for changing resistance value of the resistance portion based on the voltage received at the first external terminal; and a third external terminal for outputting the control signal to the resistance portion.

Preferably, the semiconductor integrated circuit further includes an AD converter converting the voltage received at the first external terminal to a digital signal and externally outputting the converted digital signal as the detection signal from the second external terminal.

According to another aspect, the present invention provides a semiconductor integrated circuit including: a resistance portion converting a current varying in response to an extrinsic factor to a voltage; an external terminal for externally outputting the converted voltage as a detection signal; and a control circuit outputting a control signal based on the converted voltage; wherein the resistance portion changes a resistance value based on the control signal received from the control circuit.

Preferably, the resistance portion includes a first resistor having a first terminal supplied with the current and a second terminal connected to a prescribed potential, a second resistor having a first terminal supplied with the current, and a switch element having a first terminal connected to a second terminal of the second resistor and a second terminal connected to the prescribed potential; and the switch element switches between an on state and an off state based on the control signal received from the control circuit.

According to a further aspect, the present invention provides an electronic device, including: a detecting device outputting a current varying in response to an extrinsic factor, a resistance portion converting the current received from the detecting device to a voltage and outputting the converted voltage; and a semiconductor integrated circuit; wherein the semiconductor integrated circuit includes a first external terminal for receiving the converted voltage, a second external terminal for externally outputting the voltage received at the first external terminal as a detection signal, a control circuit outputting a control signal based on the voltage received at the first external terminal, and a third external terminal for externally outputting the control signal; and the resistance portion changes resistance value based on the control signal received from the control circuit through the third external terminal.

According to a still further aspect, the present invention provides an electronic device, including: a detecting device outputting a current varying in response to an extrinsic factor; and a semiconductor integrated circuit; wherein the semiconductor integrated circuit includes a resistance portion converting the current received from the detecting device to a voltage, an external terminal for externally outputting the converted voltage as a detection signal, and a control circuit outputting a control signal based on the converted voltage; wherein the resistance portion changes a resistance value based on the control signal received from the control circuit.

By the present invention, it is possible to obtain the result of detection over a wide range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
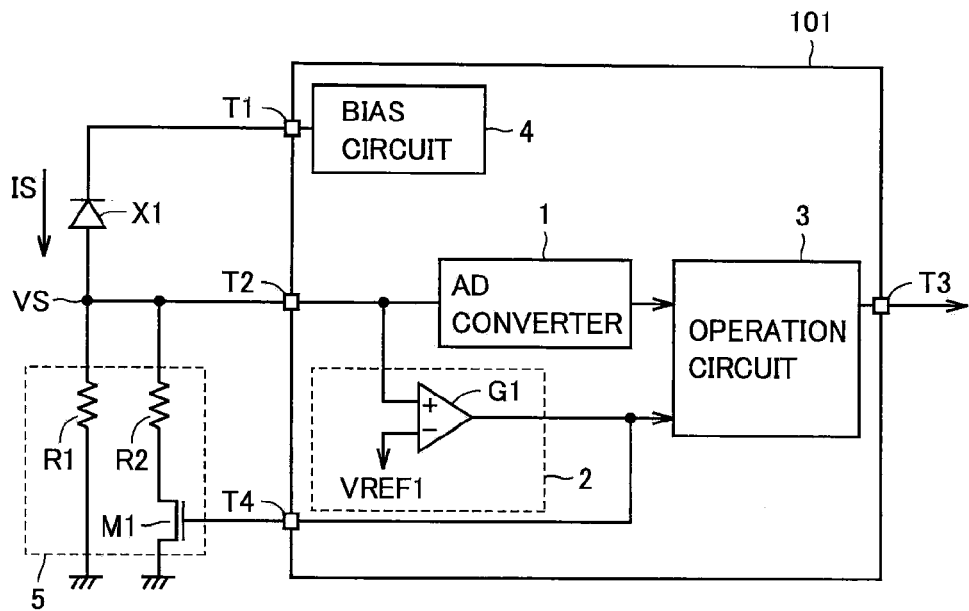
FIG. 1 shows a configuration of a semiconductor integrated circuit in accordance with a first embodiment of the present invention.

In the following, embodiments of the present invention will be described with reference to the figures. In the figures, the same or corresponding portions are denoted by the same reference characters and description thereof will not be repeated.

First Embodiment

[Configuration and Basic Operation]

FIG. 1 shows a configuration of a semiconductor integrated circuit in accordance with a first embodiment of the present invention. Referring to FIG. 1, a semiconductor integrated circuit 101 includes an AD converter 1, a control circuit 2, an operation circuit 3, a bias circuit 4, an external terminal T1, and external terminals (first to third external terminals) T2 to T4. Control circuit 2 includes a comparator G1.

Outside the semiconductor integrated circuit 101, an illuminance sensor (detecting device) X1 and a resistance portion 5 are arranged. Resistance portion 5 includes resistors R1 and R2, and an N-channel MOS (Metal Oxide Semiconductor) transistor M1.

When light enters illuminance sensor X1, a current is output from illuminance sensor X1 in accordance with the intensity of incident light.

Resistance portion 5 converts the current output from illuminance sensor X1 to a voltage, and outputs the converted voltage through external terminal T2 to AD converter 1 and control circuit 2.

AD converter 1 converts the voltage, that is, an analogue voltage received from resistance portion 5 to a digital signal, and outputs the converted digital signal to operation circuit 3.

Operation circuit 3 generates a detection signal based on the digital signal received from AD converter 1, and outputs the generated detection signal through external terminal T3 to the outside of semiconductor integrated circuit 101.

Control circuit 2 detects the voltage received from resistance portion 5, generates a control signal based on the detected voltage, and outputs the generated control signal through external terminal 4 to resistance portion 5.

Resistance portion 5 changes a resistance value based on the control signal received from control circuit 2 through external terminal 4.

Bias circuit 4 supplies a bias voltage to illuminance sensor X1.

[Operation]

Next, an operation of outputting the detection signal of the semiconductor integrated circuit in accordance with the first embodiment of the present invention will be described.

Comparator G1 compares the detected voltage, that is, the voltage received from resistance portion 5, with a reference voltage VREF1. If the detected voltage is higher than the reference voltage VREF1, the comparator outputs a control signal of a H-level to resistance portion 5 through external terminal T4, and if the detected voltage is lower than the reference voltage VREF1, outputs a control signal of a L-level to resistance portion 5 through external terminal T4.

N-channel MOS transistor M1 at resistance portion 5 is turned on if the control signal received from comparator G1 is at the H-level, and it is turned off if the control signal is at the L-level.

Specifically, when it is dark around illuminance sensor X1, the current output from illuminance sensor X1 becomes smaller and the voltage value of detection voltage received by AD converter 1 becomes lower, and therefore it is necessary to accurately detect a small voltage. Therefore, control circuit 2 turns off the N-channel MOS transistor M1 so that resistance portion 5 is implemented by resistor R1 only, whereby resistance portion 5 comes to have a larger resistance value than when it is implemented by a parallel circuit of resistors R1 and R2. Thus, the voltage received by AD converter 1 from resistance portion 5 is increased.

When it is bright around illuminance sensor X1, the current output from illuminance sensor X1 becomes larger and the voltage received by AD converter 1 from resistance portion 5 becomes higher. Therefore, there arises a possibility that the voltage exceeds the dynamic range of AD converter 1. For this reason, control circuit 2 turns on the N-channel MOS transistor M1 so that resistance portion 5 is implemented by a parallel circuit of resistors R1 and R2, whereby resistance portion 5 comes to have a smaller resistance value. Thus, the voltage received by AD converter 1 from resistance portion 5 is made smaller.

In the conventional semiconductor integrated semiconductor circuit, there is a problem that the range of detection is limited by the dynamic range of AD converter.

Figure 2A:
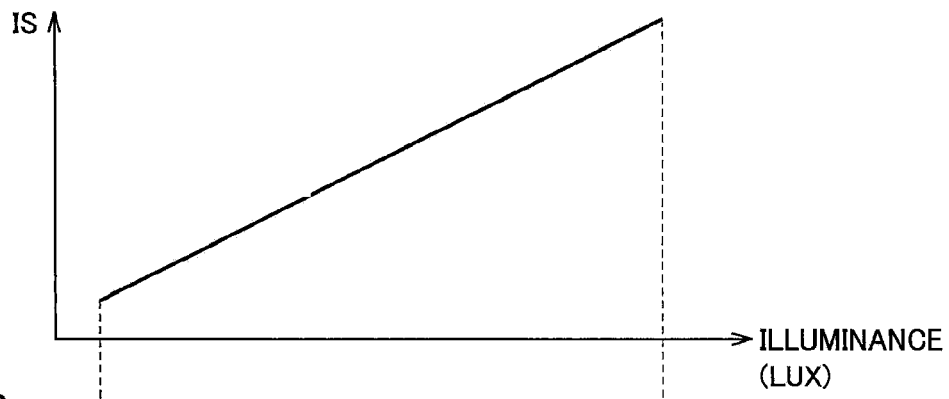
FIG. 2A shows a relation between illuminance of light received by the illuminance sensor and an output current IS of the illuminance sensor.
Figure 2B:
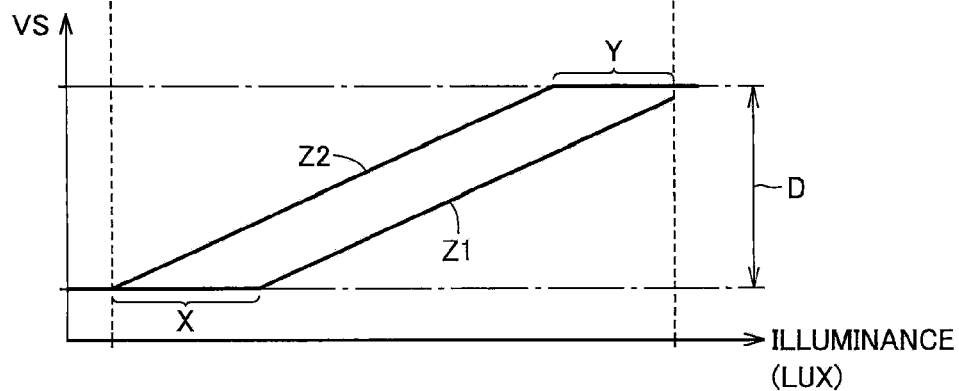
FIG. 2B shows a relation between illuminance of light received by the illuminance sensor and a voltage VS received by an AD converter, of a conventional semiconductor integrated circuit.

FIG. 2A shows the relation between the illuminance of light received by the illumninance sensor and the current IS output from the illuminance sensor. FIG. 2B shows the relation between the illuminance of light received by the illuminance sensor and the voltage VS received by the AD converter, in a conventional semiconductor integrated circuit. Z1 represents an example in which a resistor converting the output current of the detecting device to a voltage has a small resistance value RS, and Z2 shows an example in which the resistor has large resistance value RS. D represents the dynamic range of AD converter.

Referring to FIG. 2, with the small resistance value RS, the voltage VS received by the AD converter when the illuminance of light received by the illuminance sensor is low becomes smaller than the dynamic range of the AD converter. Therefore, the semiconductor integrated circuit cannot output the detection signal representing the illuminance in the range of X.

On the other hand, with large resistance value RS, the voltage VS received by the AD converter when the illuminance of light received by the illuminance sensor is high becomes larger than the dynamic range of the AD converter. Therefore, the semiconductor integrated circuit cannot output the detection signal representing the illuminance in the range of Y.

In the semiconductor integrated circuit in accordance with the first embodiment of the present invention, however, control circuit 2 detects the voltage received from resistance portion 5, generates the control signal from the detected voltage, and outputs the generated control signal through external terminal 4 to resistance portion 5. Resistance portion 5 changes the resistance value based on the control signal received from control circuit 2 through external terminal 4.

Figure 3A:
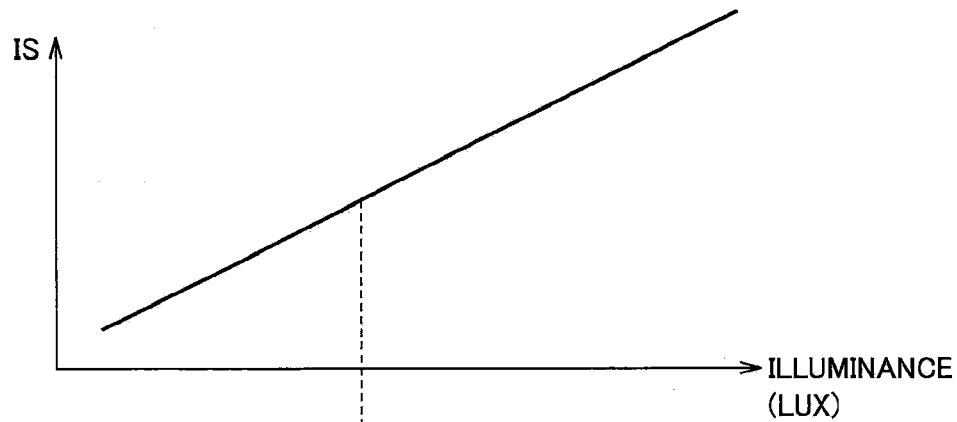
FIG. 3A shows a relation between illuminance of light received by the illuminance sensor and an output current IS of the illuminance sensor, and FIG. 3B show a relation between illuminance of light received by the illuminance sensor and a voltage VS received by an AD converter of a semiconductor integrated circuit in accordance with a first embodiment.
Figure 3B:
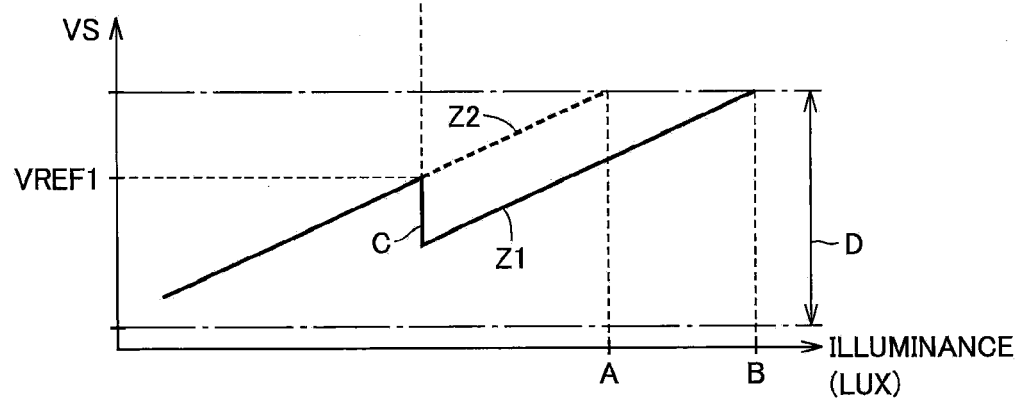

FIG. 3A shows the relation between the illuminance of light received by the illuminance sensor and the current IS output from the illuminance sensor. FIG. 3B shows the relation between the illuminance of light received by the illuminance sensor and the voltage VS received by the AD converter in the semiconductor integrated circuit in accordance with the first embodiment of the present invention. Z1 shows an example, in which the resistor converting the output current of the detecting device to a voltage has small resistance value RS, and Z2 shows an example in which the resistance value RS is large. D represents the dynamic range of AD converter.

Referring to FIG. 3, comparator G1 compares the voltage VS, that is, the detected voltage, with the reference voltage VREF1, and if the detected voltage is higher than the reference voltage VREF1, outputs a control signal of H-level to resistance portion 5 through external terminal 4. Then, N-channel MOS transistor M1 at resistance portion 5 is turned on and resistance portion 5 comes to have smaller resistance value, whereby the voltage received by AD converter 1 from resistance portion 5 becomes smaller (FIG. 3C).

In the conventional semiconductor integrated circuit, it has been impossible to output a detection signal representing illuminance larger than A, because of the limitation by the dynamic range of AD converter. In the semiconductor integrated circuit in accordance with the first embodiment of the present invention, because of the arrangement described above, it becomes possible to obtain the result of detection to the illuminance B larger than A.

Therefore, in the semiconductor integrated circuit in accordance with the first embodiment of the present invention, the resistance value of resistance portion 5 can be changed appropriately in accordance with the increase in output current of illuminance sensor X1, and the result of detection over a wide range can be obtained.

In the semiconductor integrated circuit in accordance with the first embodiment of the present invention, semiconductor integrated circuit 101 has been described as including AD converter 1 and operation circuit 3. The description is not limiting, and AD converter 1 and operation circuit 3 may be arranged outside of semiconductor integrated circuit 101, and the voltage received from resistance portion 5 through external terminal T2 may be output as the detection signal from external terminal T3 to the outside of semiconductor integrated circuit 101.

In the semiconductor integrated circuit in accordance with the first embodiment of the present invention, a configuration has been described in which illuminance sensor (detecting device) X1 and resistance portion 5 are arranged outside of semiconductor integrated circuit 101. The arrangement is not limiting, and semiconductor integrated circuit 101 may additionally include at least one of the illuminance sensor (detecting device) X1 and resistance portion 5.

A sensor which detects an extrinsic factor such as temperature, frequency of signal, vibration, acceleration or rotating velocity and outputs a current indicating the result of detection, that is, a current varying in response to the result of detection may be arranged instead of the illuminance sensor.

[Electronic Device]

Figure 4:
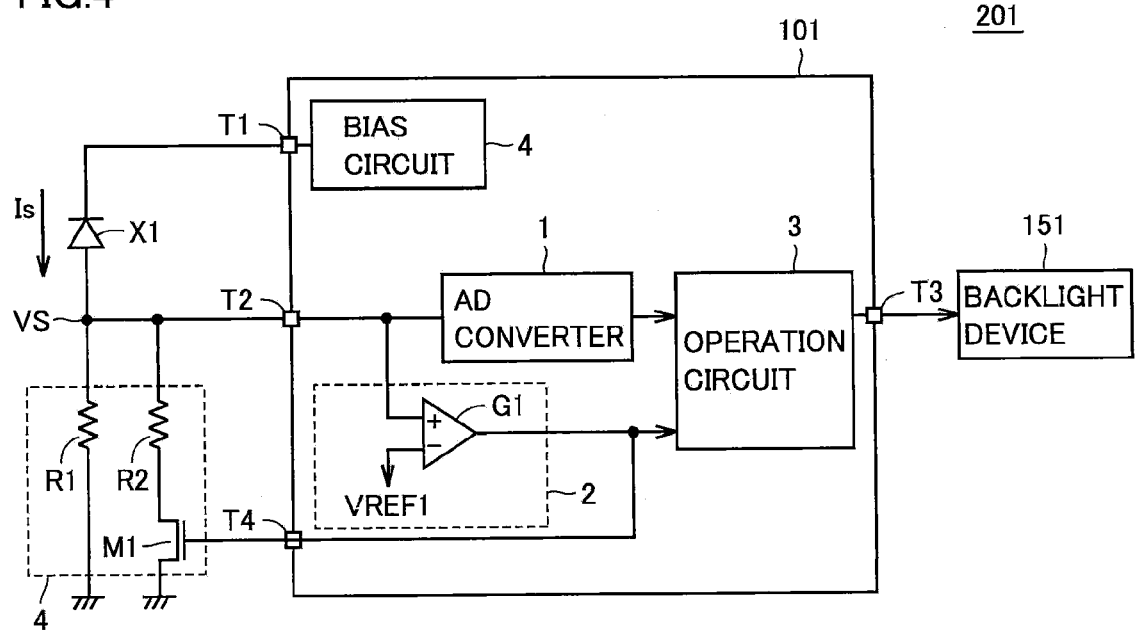
FIG. 4 shows a configuration of an electronic device in accordance with the first embodiment of the present invention.

FIG. 4 shows a configuration of an electronic device in accordance with the first embodiment of the present invention. Referring to FIG. 4, an electronic device 201 includes semiconductor integrated circuit 101, a backlight device 151, illuminance sensor X1 and resistance portion 5.

Semiconductor integrated circuit 101 outputs a detection signal to backlight device 151 based on the result of detection of illuminance sensor X1.

Based on the detection signal received from semiconductor integrated circuit 101, backlight device 151 determines the amount of light to be incident on a liquid crystal panel or the like.

In this manner, the semiconductor integrated circuit in accordance with the first embodiment of the present invention can be applied to the electronic device such as the portable telephone or a liquid crystal television.

Next, another embodiment of the present invention will be described with reference to the figures. In the figures, the same or corresponding portions are denoted by the same reference characters and description thereof will not be repeated.

Second Embodiment

The present embodiment relates to a semiconductor integrated circuit in which configurations of the control circuit and the resistance portion are made different from those of the semiconductor integrated circuit of the first embodiment. Except for the points described in the following, the semiconductor integrated circuit is the same as that of the first embodiment.

Figure 5:
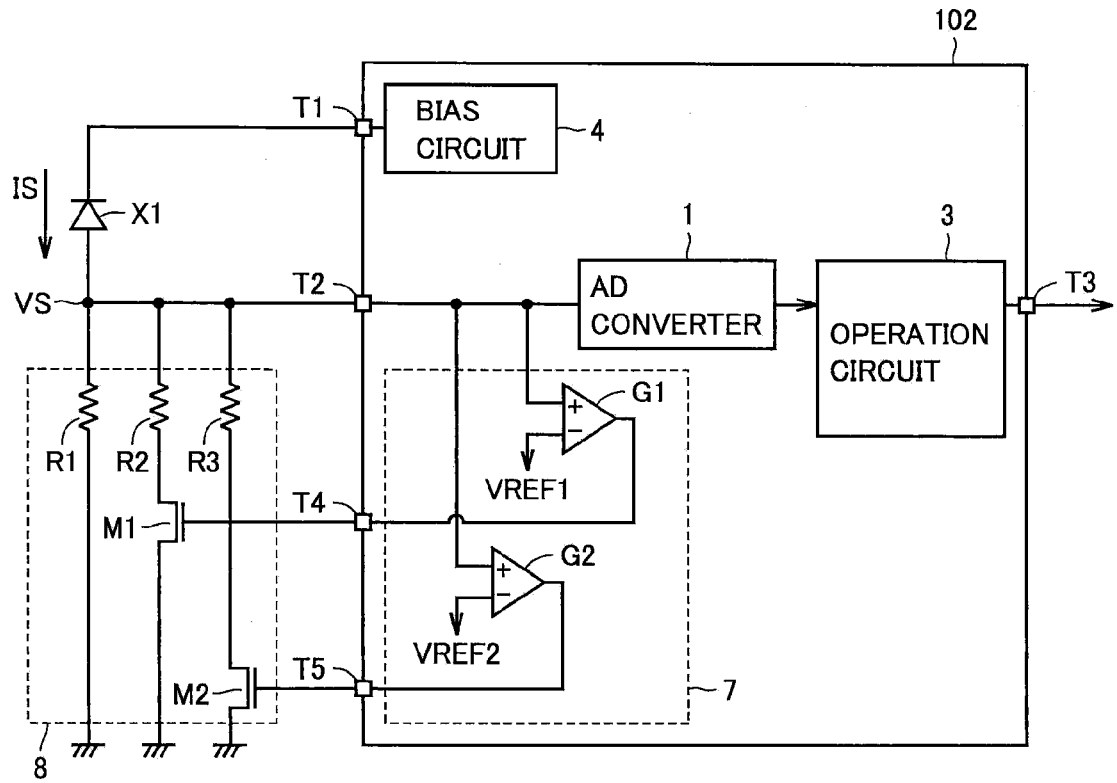
FIG. 5 shows a configuration of a semiconductor integrated circuit in accordance with a second embodiment of the present invention.

FIG. 5 shows a configuration of the semiconductor integrated circuit in accordance with the second embodiment of the present invention.

Referring to FIG. 5, a semiconductor integrated circuit 102 includes AD converter 1, a control circuit 7, operation circuit 3, bias circuit 4 and external terminals T1 to T5. Control circuit 7 includes comparators G1 and G2. Outside the semiconductor integrated circuit 102, illuminance sensor (detecting device) X1 and resistance portion 8 are arranged. Resistance portion 8 includes resistors R1 to R3 and N-channel MOS transistors M1 and M2.

Next, an operation of outputting a detection signal of the semiconductor integrated circuit in accordance with the second embodiment of the present invention will be described.

Comparator G1 compares the detected voltage, that is, the voltage received from resistance portion 8, with the reference voltage VREF1, and if the detected voltage is higher than the reference voltage VREF1, it outputs a control signal of H-level through external terminal T4 to N-channel MOS transistor M1, and if the detected voltage is lower than the reference voltage VREF1, it outputs a control signal of L-level through external terminal T4 to N-channel MOS transistor M1.

Comparator G2 compares the detected voltage, that is, the voltage received from resistance portion 8, with a reference voltage VREF2, and if the detected voltage is higher than the reference voltage VREF2, it outputs a control signal of H-level through external terminal T5 to N-channel MOS transistor M2, and if the detected voltage is lower than the reference voltage VREF2, it outputs a control signal of L-level through external terminal T5 to N-channel MOS transistor M2.

N-channel MOS transistors M1 and M2 at resistance portion 8 are turned on if the control signals received from comparators G1 and G2 are at the H level, and turned off if the control signals are at the L level, respectively.

Figure 6:
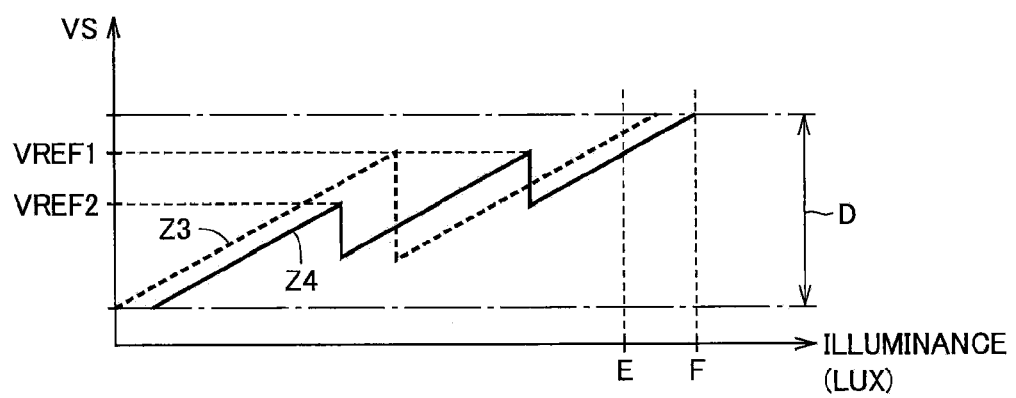
FIG. 6 shows a relation between illuminance of light received by the illuminance sensor and the voltage VS received by the AD converter in the semiconductor integrated circuits in accordance with the first and second embodiments.

FIG. 6 represents the relation between the illuminance of light received by the illuminance sensor and the voltage VS received by the AD converter, in the semiconductor integrated circuit in accordance with the first and second embodiments of the present invention. Z3 represents the example of the semiconductor integrated circuit in accordance with the first embodiment of the present invention, and Z4 represents the example of the semiconductor integrated circuit in accordance with the second embodiment of the present invention. D represents the dynamic range of AD converter. Here, description will be given assuming that reference voltage VREF1 is higher than reference voltage VREF2.

Referring to FIG. 6, when the voltage VS, that is, the detected voltage, is not higher than the reference voltage VREF2, control circuit 7 turns off N-channel MOS transistors M1 and M2, so that resistance portion 8 is implemented by resistor R1 only, whereby resistance portion 8 comes to have a larger resistance value than when it is implemented by a parallel circuit of resistors. Thus, the voltage received by AD converter 1 from resistance portion 8 is increased.

When the voltage VS is higher than the reference voltage VREF2 and not higher than the reference voltage VREF1, control circuit 7 turns off N-channel MOS transistor M1 and turns on N-channel MOS transistor M2, whereby resistance portion comes to be implemented by a parallel circuit of resistors R1 and R3, so that resistance portion 8 comes to have a smaller resistance value. Thus, the voltage received by AD converter 1 from resistance portion 8 is made smaller.

When the voltage VS becomes higher than the reference voltage VREF1, control circuit 7 turns on N-channel MOS transistors M1 and M2, whereby resistance portion comes to be implemented by a parallel circuit of resistors R1 to R3, so that resistance portion 8 comes to have even smaller resistance value. Thus, the voltage received by AD converter 1 from resistance portion 8 is made smaller.

In the semiconductor integrated circuit in accordance with the first embodiment, it has been impossible to output a detection signal representing an illuminance higher than E. Because of the configuration described above, it becomes possible by the semiconductor integrated circuit in accordance with the second embodiment to widen the range of detection to the illuminance indicated by F.

Therefore, in the semiconductor integrated circuit in accordance with the second embodiment of the present invention, the range of detection can further be widened than the semiconductor integrated circuit in accordance with the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a first terminal for receiving an analog voltage;
   an analog-to-digital converter to output a digital signal based on the analog voltage received at the first terminal;
   an operation circuit to perform a prescribed operation based on the digital signal and to output an operation result;
   a second terminal to output the operation result;
   a first control unit to compare the analog voltage received at the first terminal with a first prescribed voltage and to output a first control signal indicative of a comparison result;
   a third terminal to output the first control signal;
   a fourth terminal connected to a first end of a detection element, which has a second end connected to the first terminal; and
   a bias circuit to apply a bias voltage to the fourth terminal.

2. The semiconductor integrated circuit according to claim 1 further comprising:
   a resistance portion to convert an output current of the detection element to an analog voltage,
   wherein the first terminal is arranged to receive the analog voltage, and
   wherein the first control unit is arranged to compare the analog voltage received at the first terminal with the first prescribed voltage and to output the first control signal indicative of the comparison result, for changing a resistance value of the resistance portion, to the resistance portion through the third terminal.

3. The semiconductor integrated circuit according to claim 1, wherein the operation circuit is arranged to perform the prescribed operation based on the digital signal and the first control signal and to output the operation result.

4. The semiconductor integrated circuit according to claim 1, further comprising a resistance comprising:
   a first resistor having a first end connected to the first terminal and having a second end connected to a prescribed potential,
   a second resistor having a first end connected to the first terminal and having a second end, and
   a switch element connected to the second end of the second resistor to switch on and off based on the first control signal received from the third terminal.

5. The semiconductor integrated circuit according to claim 2, further comprising a second control unit to compare the analog voltage received at the first terminal with a second prescribed voltage and to output a second control signal indicative of a comparison result.

6. The semiconductor integrated circuit according to claim 5, further comprising a fifth terminal for outputting the second control signal.

7. The semiconductor integrated circuit according to claim 6, wherein the second control unit wherein the second control signal is output to the resistance portion through the fifth terminal for changing a resistance value of the resistance portion.

8. An electronic device comprising:
   a detection element having a first end and a second end; and
   a semiconductor integrated circuit comprising:
      a first terminal for receiving an analog voltage connected to the second end of the detection element;
      an analog-to-digital converter to output a digital signal based on the analog voltage received at the first terminal;
      an operation circuit to perform a prescribed operation based on the digital signal and to output an operation result;
      a second terminal to output the operation result;
      a first control unit to compare the analog voltage received at the first terminal with a first prescribed voltage and to output a first control signal indicative of a comparison result;
      a third terminal to output the first control signal;
      a fourth terminal connected to the first end of the detection element; and
      a bias circuit to apply a bias voltage to the fourth terminal.

* * * * *